US011653150B2

(12) United States Patent
Lesso et al.

(10) Patent No.: US 11,653,150 B2
(45) Date of Patent: May 16, 2023

(54) LOAD DETECTION

(71) Applicant: Cirrus Logic International Semiconductor Ltd., Edinburgh (GB)

(72) Inventors: John Paul Lesso, Edinburgh (GB); Mark James McCloy-Stevens, Edinburgh (GB); John Bruce Bowlerwell, Dunfermile (GB); Yanto Suryono, Tokyo (JP); Xin Zhao, Edinburgh (GB); Morgan Timothy Prior, East Lothian (GB)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 17/516,830

(22) Filed: Nov. 2, 2021

(65) Prior Publication Data

US 2022/0060832 A1 Feb. 24, 2022

Related U.S. Application Data

(63) Continuation of application No. 16/709,075, filed on Dec. 10, 2019, now Pat. No. 11,206,487.
(Continued)

(30) Foreign Application Priority Data

Jan. 18, 2019 (GB) ...................................... 1900760

(51) Int. Cl.
*H04R 5/04* (2006.01)
*H03F 3/183* (2006.01)
(Continued)

(52) U.S. Cl.
CPC .............. *H04R 5/04* (2013.01); *H03F 3/183* (2013.01); *H03G 3/3005* (2013.01); *H04R 5/02* (2013.01);
(Continued)

(58) Field of Classification Search
None
See application file for complete search history.

(56) References Cited

U.S. PATENT DOCUMENTS 10,045,124 B2 * 8/2018 Lesso ....................... H04R 5/04
2009/0108854 A1 4/2009 Agevik et al.
(Continued)

FOREIGN PATENT DOCUMENTS

| CN | 1682441 A | 10/2005 |
| EP | 2763433 A1 | 8/2014 |
| GB | 2545753 A | 6/2017 |

OTHER PUBLICATIONS

Search Report, China National Intellectual Property Administration, CN Application No. 201980087567.8, dated May 19, 2022.
(Continued)

*Primary Examiner* — Paul W Huber
(74) *Attorney, Agent, or Firm* — Jackson Walker L.L.P.

(57) ABSTRACT

This application relates to audio driving circuitry (100), and in particular to audio driving circuitry for outputting first and second audio driving signals for driving a stereo audio load (106), which may be a stereo audio load of an accessory apparatus (102) removably coupled to the audio driving circuitry in use. A load monitor (111) is provided for monitoring to monitor, from a monitoring node (112), an indication of a common mode return current passing through a common return path, together with an indication of a common mode component of the first and second audio driving signals and to determine an impedance characteristic of the stereo audio load. The load monitor (111) can provide dynamic monitoring of any significant change in load impedance. In some embodiments the load monitor (111) comprises an adaptive filter (301) which adapts a parameter of the filter which is related to the load impedance so as to determine the indication of load impedance.

20 Claims, 3 Drawing Sheets

Related U.S. Application Data (60) Provisional application No. 62/777,947, filed on Dec. 11, 2018.

(51) Int. Cl.
    *H03G 3/30*    (2006.01)
    *H04R 29/00*   (2006.01)
    *H04S 1/00*    (2006.01)
    *H04R 5/02*    (2006.01)

(52) U.S. Cl.
    CPC ........... *H04R 29/001* (2013.01); *H04S 1/007* (2013.01); *H03G 2201/103* (2013.01)

(56) References Cited

U.S. PATENT DOCUMENTS

| | | |
|---|---|---|
| 2011/0099298 A1 | 4/2011 | Chadbourne et al. |
| 2012/0051562 A1 | 3/2012 | Kim |
| 2012/0134503 A1 | 5/2012 | Poulsen et al. |
| 2014/0093103 A1 | 4/2014 | Breece, III et al. |
| 2014/0219463 A1 | 8/2014 | Poulsen et al. |
| 2014/0233741 A1 | 8/2014 | Gustavsson |
| 2014/0376753 A1 | 12/2014 | Nystrom et al. |
| 2015/0296291 A1 | 10/2015 | Macours |
| 2016/0127828 A1 | 5/2016 | Maher et al. |
| 2017/0150283 A1 | 5/2017 | Taylor et al. |
| 2017/0280240 A1 | 9/2017 | Rong et al. |
| 2017/0280244 A1 | 9/2017 | Scarlett et al. |
| 2017/0353799 A1* | 12/2017 | Sun ................ G10L 19/00 |
| 2018/0213322 A1 | 7/2018 | Napoli et al. |
| 2019/0098296 A1 | 3/2019 | Jeon et al. |

OTHER PUBLICATIONS

International Search Report and Written Opinion of the International Searching Authority, International Application No. PCT/GB2019/053482, dated Feb. 27, 2020.

Combined Search and Examination Report under Sections 17 and 18(3), UKIPO, Application No. GB1900760.8, dated Mar. 28, 2019.

* cited by examiner

LOAD DETECTION

The present disclosure is a continuation of U.S. Non-Provisional patent application Ser. No. 16/709,075, filed Dec. 10, 2019, which claims priority to U.S. Provisional Patent Application No. 62/777,947, filed Dec. 11, 2018, and United Kingdom Patent Application No. GB1900760.8, filed Jan. 18, 2019, each of which is incorporated by reference herein in its entirety.

FIELD OF DISCLOSURE

The field of representative embodiments of this disclosure relates to methods, apparatus and/or implementations concerning or relating to determining properties of an audio load connected, in use, to an audio output circuit, for example for determining an indication of load impedance, in particular the impedance of an accessory apparatus.

BACKGROUND

Many electronic devices have the ability to provide audio driving signals to audio output transducers, e.g. loudspeakers, of an accessory or peripheral apparatus that may, in use, be removably connected to the electronic device via some wired connection. For example many electronic devices may have a receptacle, such as a 3.5 mm jack-socket for example, for in use, receiving a corresponding mating plug, such as a 3.5 mm jack-plug for example, of an accessory apparatus for providing analogue audio driving signals to drive loudspeakers of the accessory apparatus, for example a set of headphones or earbuds or the like. Typically the audio driver circuit may output stereo audio driving signals, i.e. separate left and right audio driving signals.

There is a wide variety of different audio accessory apparatus that may, in use, be connected to such an electronic device, and the audio output transducers of the accessory apparatus may have quite different properties, in particular impedance, from one accessory to another. Different accessories may thus present quite different audio loads to the audio driving circuit of the electronic device. For example, some high quality headphone accessories may have a load impedance, for DC, of the order of several hundred ohms, whereas other headset or earbud arrangements may provide audio loads with a load impedance, at DC, of only a few ohms.

To provide suitable audio driving signals for driving accessories that present a relatively high impedance load, the audio driving circuitry may be able to generate relatively large amplitude driving signals. For accessories that present a relatively low impedance load however, very high amplitude driving signals should preferably be avoided to avoid overdriving the loudspeakers of the accessory, which could potentially damage or degrade the loudspeaker and/or result in high sound pressure levels that may be uncomfortable or even potentially damaging for a user.

It is therefore known to detect connection and disconnection of an accessory device, for instance via operation of a mechanical switch within the jack-socket.

On detection of connection of an accessory device, an initial measure of the impedance of the audio load may be performed and at least one parameter of the audio driver circuit, such as a maximum drive level, configured accordingly. This does allow an audio driver circuit to operate satisfactorily with a range of different accessory devices, but rely on a clear initial detection of connection of an accessory.

SUMMARY

Embodiments of the present disclosure relate to methods, apparatus and systems for determining properties of a load that can operate dynamically in use.

According to an aspect of the disclosure there is provided audio driving circuitry comprising:

first and second audio channels for outputting first and second audio driving signals for a stereo audio load comprising first and second audio loads;
a common return path for the first and second audio loads to a defined reference voltage; and
a load monitor configured to monitor an indication of a common mode return current passing through the common return path and an indication of a common mode component of the first and second audio driving signals and determine an impedance characteristic of the stereo audio load.

In some embodiments the load monitor may comprise an adaptive filter for adapting a parameter related to the impedance of the stereo audio load. The adaptive filter may be configured to minimise the error between a first value and a second value, wherein the first value is based on the indication of a common mode return current and the parameter related to impedance. The second value may be based on the indication of common mode component of the first and second driving signals. In some implementations the adaptive filter may comprise a controller configured to iteratively adapt a present value of the parameter related to impedance by an adaption value proportional to the error between the first and second values.

The adaption value may also be proportional to a first value based on the indication of the common mode return current. In some embodiments the controller may be configured to determine the first value as a function of the indication of the common mode return current, such that a ratio between the first value and the indication of the common mode return current is greater for at least some values of the indication of the common mode return current in a lower range than for at least some values of the indication of the common mode return current in a higher range.

In some implementations the adaption value may also be proportional to a convergence factor. In some embodiments the controller may be configured to vary the value of the convergence factor based on an indication of expected signal level, such that the convergence factor is greater for at least some lower expected signal levels than for at least higher expected signal levels.

In some implementations the adaptive filter is configured to implement a least mean squares algorithm. In some implementations the adaptive filter comprises a single tap adaptive filter, although in other implementations multi-tap filter arrangement may be used.

The common return path may comprise a resistance between the monitoring node and the defined reference. The indication of the common mode return current may comprise a voltage of the monitoring node.

The load monitor may, in some examples, comprise a common-mode module configured to receive an indication of the first and second audio driving signals and determine said indication of the common-mode component. In some implementations the common-mode module may be further configured to determine a differential component of the first and second audio driving signals. The load monitor may be configured to determine if there is an insufficient common-mode component of the driving signals compared to the differential component, and, in the event that an insufficient common-mode component is detected, to pause determination of the impedance characteristic. The load monitor may determine there is an insufficient common-mode component, compared to the differential component, if the common-mode component is below a defined common-mode threshold whilst the differential component is above a differential threshold.

In some examples the load monitor may comprise a level detector configured to determine whether the indication of common mode return current is above or below at least defined threshold. The level detector may be configured to determine whether the indication of common mode return current is above a defined upper magnitude threshold corresponding to an upper limit of an impedance range classified as low impedance. Additionally or alternatively the level detector may be configured to determine whether the indication of common mode return current is below a defined lower magnitude threshold corresponding to a lower limit of an impedance range classified as high impedance. Additionally or alternatively the level detector may be configured to determine whether the indication of common mode return current is below a noise threshold. The load monitor may be configured to pause determination of the impedance characteristic if the indication of common mode return current is below the noise threshold.

Each of the first and second audio channels may comprise a respective audio output driver powered by a power supply. In some embodiments the audio driving circuitry may, based on the indication of impedance determined by the load monitor control at least one of: a maximum output voltage magnitude of an audio output driver; and a maximum output voltage magnitude from the power supply to the audio output driver.

In some implementations the load monitor may be further configured to receive at least one of: an indication of signal clipping from an audio output driver; and an indication of current limiting in the power supply.

The audio driving circuitry may be implemented as an integrated circuit.

Embodiments also relate to an electronic device comprising audio driving circuitry according to any of variants described herein and a connector for making a removable mating connection with an accessory apparatus in use. The first and second audio channels may be configured to output the first and second audio driving signals to first and second electrical contacts of the connector and the common return path may connect to a third electrical contacts of said connector.

The device may be at least one of: a portable device, a battery powered device, a communication device; a mobile or cellular telephone device or a smartphone; a computing device; a tablet, notebook, laptop or desktop computer; a wearable device; a smartwatch; a voice activated or voice controlled device.

In another aspect there is provided audio driving circuitry comprising:
  first and second audio channels for outputting first and second audio driving signals for a stereo audio load;
  a common return path for the stereo audio load to a defined reference voltage; and a load monitor configured to monitor a monitoring node of the common return path; and
  an indication of the first and second audio driving signals and determine an impedance characteristic of the audio load;
  wherein the common return path comprises a resistance between the monitoring node and the defined reference voltage; and
  wherein the load monitor comprises an adaptive filter for adapting a parameter related to the impedance of the stereo audio load.

In further aspect there is provided audio driving circuitry comprising:
  first and second audio channels for outputting first and second audio driving signals for first and second audio loads;
  a common return path for the first and second audio loads; and
  a load monitor configured to monitor a voltage at a monitoring node of the common return path and determine a characteristic of impedance of the first and second audio loads;
  wherein the load monitor comprises an adaptive filter configured to adapt a parameter related to the impedance of the first and second audio loads based on the voltage at the monitored node and a common mode voltage arising from first and second audio driving signals.

Unless expressly indicated to the contrary, any of the various features of the various implementations discussed herein may be implemented together with any one or more of the other described features in any and all suitable combinations.

BRIEF DESCRIPTION OF THE DRAWINGS

For a better understanding of examples of the present disclosure, and to show more clearly how the examples may be carried into effect, reference will now be made, by way of example only, to the following drawings in which.

DETAILED DESCRIPTION

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

As discussed above, a host device may include audio driver circuits, e.g. headphone amplifier circuits, capable of outputting audio drive signals to an accessory apparatus that, in use, is removably connected to the host device. It can be beneficial to configure at least one parameter of the audio driver circuit, for example a drive limit, based on a property of the audio load of the accessory apparatus, e.g. the load impedance. As also discussed above, connection of an accessory apparatus may be determined via some plug detect arrangement, for instance via operation of a mechanical switch within a socket and, on determination of connection of an accessory apparatus, some measurement of the connected audio load may be made in order to classify the audio load and configure the audio driving circuit accordingly.

In some instances however detecting that an accessory has been connected may not readily be possible by plug, e.g. jack, detect circuitry of the host device. For instance a mechanical switch for detecting plug insertion may fail to operate correctly, for example due to being blocked by dirt or foreign objects within the socket. Also, in some instances the apparatus which is connected to the host device may itself have a connector, such as a socket, to which an audio accessory may be connected.

For example, some host devices may have a general purpose connector interface, such as a USB interface or similar, e.g. a USB-C connector, which is capable of digital data transfer with a suitable peripheral apparatus, but which is also capable of transfer of analogue audio signals in one mode, e.g. an Audio Adapter Accessory mode. For instance, an adapter or dongle may comprise a USB plug, for interfacing with a USB receptacle of the host device, and also at least one 3.5 mm jack socket for mating with a jack plug of an audio accessory such as a set of headphones. Analogue signal paths within the dongle extend between defined pins of the USB plug and the poles of the jack socket(s). If such an adapter or dongle is plugged into a USB receptacle of the host device, the USB interface of the host device may be configured to operate in an analogue mode, with the audio driving circuitry providing audio drive signals to the relevant pins of the USB receptacle. In some instances there may be no jack detect arrangement within the host device, or any jack detect arrangement within the host device may not always be able to detect insertion of an audio accessory to the external socket of the adapter.

Embodiments of the present disclosure thus relate to monitoring of audio loads being driven by audio driving circuitry so as to detect any significant changes in audio load. At least some embodiments relate to arrangements for determining the impedance of an audio load, and in particular of a stereo audio load with a common return path. Embodiments can provide an indication of any significant changes in audio load without requiring any trigger from a jack detect arrangement or similar and thus can provide audio driving circuitry (and/or the wider system of the host device) with dynamic response to any significant changes in audio load in use.

Figure 1:
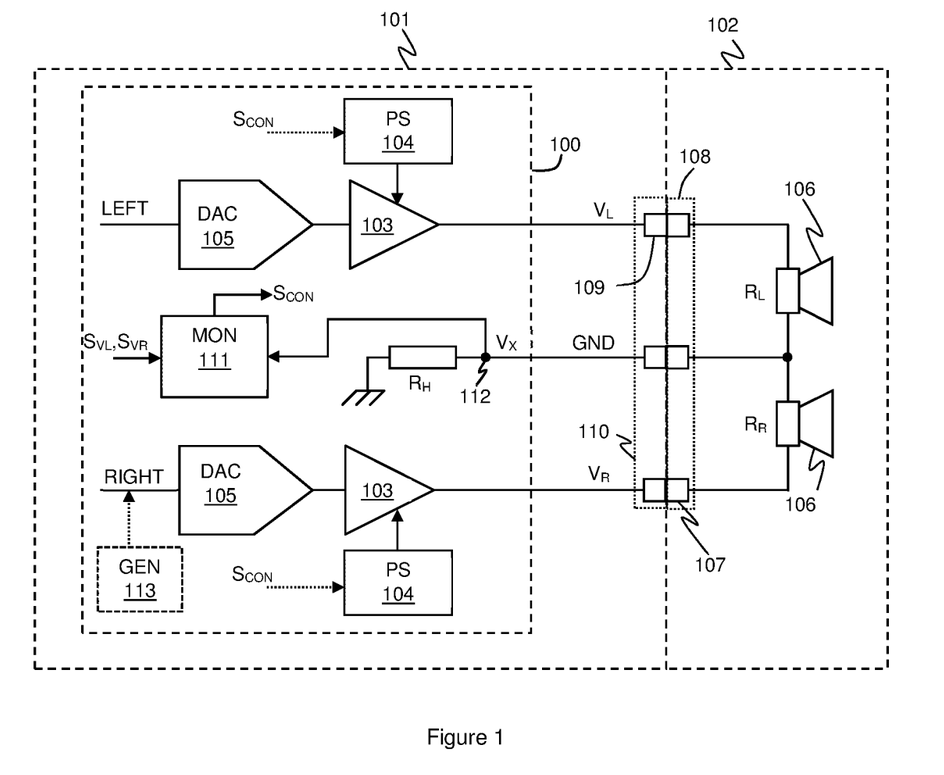
FIG. 1 illustrates an example of audio circuitry of a host device for driving audio signals to an audio accessory.

FIG. 1 illustrates one simplified example of audio driving circuitry 100 of a host device 101 for driving an audio load of an accessory apparatus 102. The audio driving circuitry 100 comprises first and second audio signal paths, in this case LEFT and RIGHT audio channels, for producing first and second audio driving signals $V_L$ and $V_R$ respectively. In this example each signal path comprises an output driver 103, e.g. a suitable amplifier, for generating respective left and right driving signals $V_L$ and $V_R$. In some examples the output driver 103 may be an amplifier such as a class-D amplifier, although other arrangements, such as class-AB type amplifiers may be used. The output driver may receive a supply voltage from a power supply 104, which may comprise a DC-DC converter such as a charge pump for example. In use, the power supply 104 may receive one or more input voltages, e.g. a battery voltage, and regulate the voltage for supply to the output driver 103, possibly as bipolar supply voltages. The power supply 104 may be operable to provide different magnitudes of supply voltage (V1, V2, . . . VN) to the output driver 103 and may be operable in a high power mode to provide suitable supplies to the output driver so as to provide higher magnitude voltage driving signals $V_L$ and $V_R$ for driving high impedance loads.

In the example of FIG. 1 the LEFT and RIGHT signals paths of the audio driving circuitry 100 each also comprise a DAC (digital-to-analogue converter) 105.

The driving signals $V_L$ and $V_R$ generated by the output drivers 103 are used to drive respective audio loads, in this case loudspeakers 106 of accessory apparatus 102, e.g. headphone or earbud speakers or the like. The driving signals thus drive a stereo audio load, i.e. a load comprising first and second loudspeakers operable to be driven simultaneously by respective first and second driving signals. In use, the accessory apparatus 102 may be removably connected to the host device via suitable plug and socket connectors, such as a jack plug of the accessory apparatus and a jack socket of the host device, but any suitable connectors may be used, and in some instances there may be at least one intermediate apparatus (not shown in FIG. 1) between the host device 101 and the audio accessory 102 being driven. In use, contacts 107 of the audio accessory apparatus 102, for example poles of a jack plug (generically indicated by dotted box 108) will be coupled, directly or indirectly, to respective contacts 109 of the host device 101, for example poles of a jack socket (generically indicated by dotted box 110). The stereo loudspeakers 106 of the audio accessory apparatus 102 share a common return path to a defined reference voltage, in this example to ground, via one contact/pole 107 of the connector 108 of the accessory apparatus. The ground return path GND within the host device 101 may extend back to the audio driver circuitry 100 as illustrated.

To provide monitoring of the properties of the audio load, and in particular the impedance of the stereo speakers 106, a load monitor 111 is configured to monitor the electrical properties of the ground return path GND in use, when the audio driving circuitry 100 is operating. The load monitor 111 may, for instance, monitor an indication of current flowing in the ground return path. The load monitor 111 may monitor the electrical properties of the ground return path GND at a monitoring node 112. In some embodiments the monitoring node 112 may be selected such that there is at least some resistance $R_H$ between the monitoring node 112 and the connection to ground (or other defined reference voltage if the return path is not a ground return). The resistance $R_H$ may have a relatively small value of resistance, for instance less than 1 ohm in some examples, and may arise from components that would ordinarily be present in the ground return path such as a parasitic resistance(s) for example, i.e. the resistance $R_H$ need not be a resistance specifically introduced for allowing monitoring of the node 112.

For example, although FIG. 1 illustrates just three analogue paths between the audio driving circuitry 100 and connector, e.g. socket, 110 of the host device, typically there will be at least a fourth signal path for outputting a microphone bias to a microphone of an accessory (if present) and for receiving microphone signals from any such microphone. A jack socket 110 of the host device may therefore comprise a four pole socket, for instance such as the known TRRS (tip-ring1-ring2-sleeve) socket arrangement. Conventionally, with a TTRS plug and socket arrangement, the left and right audio driving signals $V_L$ and $V_R$ are supplied to the tip and ring1 poles of the socket. However different audio accessories may use different poles for the ground and microphone contacts; some accessories use ring2 for ground and the sleeve contact for microphone whereas other accessories use these contacts in the opposite arrangement. Generally the audio driving circuitry 100 will be designed to operate with accessories of either configuration and thus may comprise switches for establishing the ground and microphone signal paths to appropriate poles of the socket 110 depending on the type of accessory connected. In use therefore an established ground return path may comprise at least one switch element, which will provide some small inherent resistance in the on-state, and such a switch may form at least part of the resistance $R_H$. The switch may, for instance comprise one or more MOS devices that will have an associated on-resistance as will be understood by one skilled in the art.

As noted above, the ground return path GND from the accessory apparatus 102 may, in at least some implementations, return to the audio circuitry 100, that is when the audio driving circuitry 100 is integrated as part of an integrated circuit or chip, the ground return path GND from the accessory apparatus may be brought on-chip, and any switches for establishing an appropriate ground return path may also be integrated on chip. The monitoring node 112 may thus, in some embodiments, be a node of an integrated circuit comprising the audio driving circuitry 100. Even if the ground return path or any ground return path switches are not on the same chip as the audio driving circuitry, the monitoring node may be connected to circuitry on that chip.

The voltage $V_X$ at the monitoring node 112 will be a function of the driving voltages $V_L$ and $V_R$ applied to the left and right loudspeakers 106 and the respective impedances $R_L$ and $R_R$ of those speakers, as well as the resistance $R_H$.

For most audio accessory apparatus, the left and right loudspeakers 106 will be of the same type and thus it can be assumed that the impedance of the right and left loudspeakers will be substantially the same as each other, i.e. it can be assumed that $R_L=R_R$, at least for the accuracy required for accessory type detection. In this case the audio system can be represented by the simplified model shown in FIG. 2, in which an average of the voltages $V_L$ and $V_R$ is applied to a common impedance $R_C$, the common impedance being that arising from the left and right loudspeakers in parallel. In other words, a common-mode voltage $V_C$, where $V_C=(V_L+V_R)/2$, is applied to the common impedance $R_C$, where $R_C$ is equal to $R_L\|R_R$, which is the impedance of $R_L$ and $R_R$ in parallel (which for $R_L=R_R$ is equal to $R_L/2$ or equivalently $R_R/2$).

Figure 2:
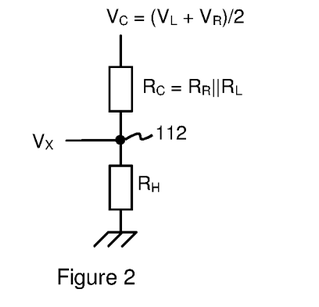
FIG. 2 illustrates a simplified model of stereo loudspeakers of an audio accessory.

The voltage $V_X$ at the monitoring node 112 is thus given by:

$$V_X=V_C \cdot R_H/(R_C+R_H) \quad \text{Eqn. 1}$$

In which case the value of common impedance $R_C$ can be expressed as:

$$R_C=R_H \cdot (V_C-V_X)/V_X \quad \text{Eqn. 2}$$

The common impedance $R_C$, which is an indication of the impedance of the loudspeakers of the accessory, may thus be determined as a function of the resistance $R_H$ of the ground return path, which can be predetermined and known, at least to an acceptable tolerance, and also the common-mode voltage $V_C$ of the driving signals and the voltage $V_X$ at the monitoring node 112.

The load monitor 111 can thus monitor the voltage $V_X$ at the monitoring node 112 (or equivalently the current) and also receive indications $S_{VL}$ and $S_{VR}$ of the driving signals $V_L$ and $V_R$ and thus determine a parameter related to the common impedance $R_C$, which itself is related to the impedance of the individual loudspeakers as noted above.

To provide an indication of the common impedance $R_C$, a processing module could be implemented to receive the indications of the driving signals $V_L$ and $V_R$ and also an indication of the monitored voltage $V_X$ and solve equation 2 using a stored value for $R_H$.

However, the signal level of the voltage at the node $V_X$ may be expected to be relatively low. As noted the impedance of the audio load may be of the order of tens or hundreds of ohms, whereas the resistance $R_H$ of the ground return path may be less than 1 ohm. From equation 1 it can be seen that if the resistance $R_H$ was the order of 0.5Ω say, and the common impedance $R_C$ of the audio load was say 200Ω, then a common-mode voltage of 1V would only result in a voltage $V_X$ of under 2.5 mV. Thus, the voltage $V_X$ at the monitoring node could be relatively low, say of the order of a few millivolts or less than 1 mV. There will be noise associated with monitoring of the monitoring node 112, which could in some instances be of the order of 1 mV.

A processing module that tried to solve equation 2 directly could thus suffer significantly from noise and could produce estimates for the common impedance $R_C$ that vary widely over time due to the small signal at the monitoring node 112 and the associated noise. Such a variation would cause problems for reliable detection of a change in load impedance during operation of the audio driving circuitry.

In some embodiments of the present disclosure the load monitor 111 instead implements an adaptive filter. The adaptive filter may be configured to adapt a parameter of the filter which is related to the common impedance $R_C$, so as to minimise an error between a first value and a second value, where the first value is based on the currently estimated value of the parameter (and hence the common impedance $R_C$) and the monitored voltage $V_X$. In some implementations the second value may be based on the common-mode voltage $V_C$. In some implementations at least one of the first and second values may also be based and the resistance $R_H$ of the ground return path.

From equation 2 it can be seen that:

$$V_X(R_H+R_C)=V_C \cdot R_H \quad \text{Eqn. 3}$$

or, in other words the error e given by:

$$e=V_C \cdot R_H-V_X(R_C+R_H) \quad \text{Eqn. 4}$$

should be zero.

The adaptive filter may thus be configured to adjust a parameter related to the value of the common impedance $R_C$ in order to minimise the error of equation 4 or some equivalent formulation. The adaptive filter may implement for example a mean squares algorithm such as a least mean squares (LMS) algorithm.

Use of an adaptive filter in this way is robust to noise associated with the monitored node 112. The parameter or coefficients of the adaptive filter are adapted over time and, for a constant value of common impedance $R_C$, settle to a value which can be a good indication of common impedance $R_C$. This approach also advantageously avoids the need to determine a divide operation, as would be required to solving equation 2 based on a monitored value of $V_X$. Divide operations can be relatively complex operations to implement, and may require relatively significant amounts of analogue or digital circuitry, with consequential adverse impacts on cost, size and power consumption.

Figure 3A:
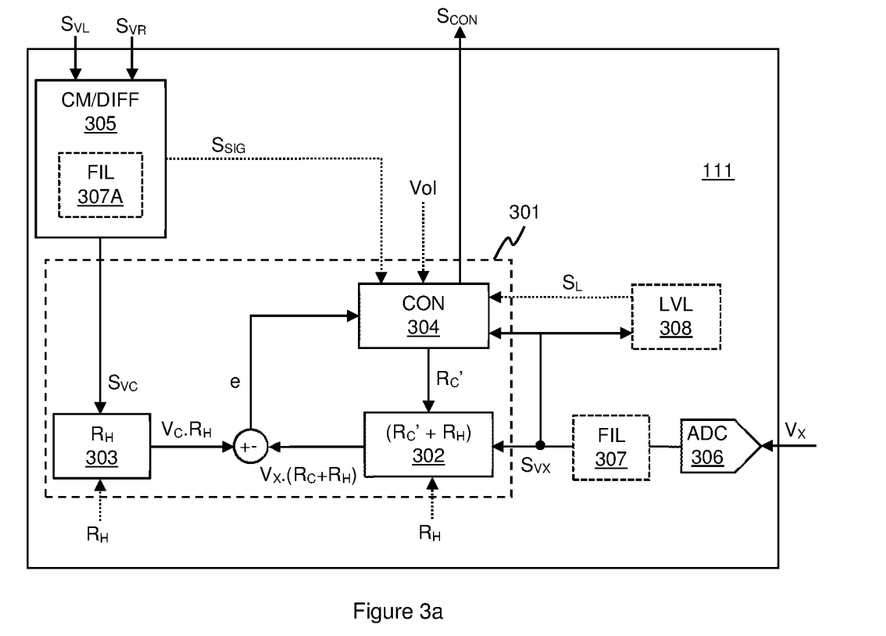
FIGS. 3a and 3b illustrate examples of a load monitor with an adaptive filter according to embodiments.

FIG. 3a illustrates one example of the load monitor 111 with an adaptive filter 301 according to an embodiment.

In this example the adaptive filter comprises only a single tap. Other examples may comprise an adaptive filter with multiple taps, as discussed later. For an adaptive filter with multiple taps the parameter which is adapted may thus comprise a series or vector of tap weight, rather than some scaler value.

The adaptive filter 301 comprises a first gain block 302 that receives an indication $S_{VX}$ of the voltage $V_X$ at the monitored node and which applies a gain which is a function of $R_C'$, where $R_C'$ is an estimate of the common impedance $R_C$. In the example of FIG. 3*a* the gain block 302 applies a gain which is related to $R_H + R_C'$ where $R_H$ is a predetermined value for the known impedance of the relevant part of the ground return path. The output of the first gain block 302 in this example is thus a first value which is proportional to $V_X \cdot (R_C' + R_H)$. This first value is subtracted from a second value, which in this example depends on the common mode voltage $V_C$. The adaptive filter 301 of FIG. 3*a* comprises a second gain block 303 that receives a signal $S_{VC}$ indicative of the common mode voltage $V_C$ and which applies a gain based on the predetermined value of the resistance $R_H$ of the ground return path. The output of the second gain block 303 is thus a second value which is proportional to $V_C \cdot R_H$.

The difference between the first and second values is determined as an error value e, which is supplied to a controller 304. The controller 304 adapts a parameter of the filter, in the example of FIG. 3*a* the present estimate of the common impedance $R_C'$, based on the error. In this example the controller 304 also adapts the estimate of the common impedance $R_C'$ based on the value of $V_X$. For instance, in one example the controller 304 adapts the estimate of $R_C'$ according to:

$$R_C' \to R_C' - \mu . e . V_X \qquad \text{Eqn. 5}$$

where μ is a convergence factor. The adapted or updated estimate $R_C'$ of common impedance is supplied to the first gain unit 302 to update the gain applied.

Equation 5 represents an implementation of a least means squares (LMS) algorithm to solve equation 4. Other examples may use other methods of solving equation 4 such as known least squares (LS) or recursive least squares (RLS) algorithms.

To provide the signal $S_{VC}$ indicative of the common-mode voltage $V_C$, the load monitor 111 may comprise a CM module 305 which receives indications $S_{VL}$ and $S_{VR}$ of the driving signals $V_L$ and $V_R$ and determines the indication $S_{VC}$ of the common-mode voltage $V_C$. In some implementations the CM module 305 may receive analogue versions of the driving signals $V_L$ and $V_R$, for example tapped from the analogue outputs. In which case the received signals $S_{VL}$ and $S_{VR}$ could be combined to form an analogue common-mode voltage signal.

The adaptive filter 301 could be implemented, at least partly, by analogue circuitry, and at least the second gain element 303 could be an analogue gain element. However it will generally be convenient to implement the adaptive filter 301 in the digital domain, in which case the first and second gain elements may comprise digital multipliers.

The CM module 305 may receive the indications $S_{VL}$ and $S_{VR}$ of the driving signals as digital signals, for instance from the digital part of the LEFT and RIGHT signal paths prior to the DACs illustrated in FIG. 1. In determining the indication $S_{VC}$ of the common mode voltage $V_C$, the CM module may take into account any gain within the analogue parts of the LEFT and RIGHT signal paths. Such gain may comprise fixed gain or a variable gain such as resulting from an analogue volume control.

The load monitor 111 may thus also comprise an ADC 306 with an input coupled to the monitoring node 112 to provide the indication $S_{VX}$ of the voltage $V_X$ as a digital signal. In some embodiments a filter arrangement 307 may be arranged to filter the output of the ADC 306 to provide the indication $S_{VX}$ of the voltage $V_X$. The filter arrangement 307 may be arranged to provide some high-pass filtering and/or some low pass filtering as will be discussed below. Any such filtering may also be replicated and applied in CM module 305, for instance by a similar or matching filter arrangement 307A.

The operation of the adaptive filter 301 is thus to adapt the relevant parameter, i.e. the estimate $R_C'$ for the example of FIG. 3*a*, to minimise the error. Over time the adaptive filter 301 stabilises to a relatively stable value of the relevant parameter, e.g. the estimate $R_C'$, which thus can be used as a good estimate of the common impedance value $R_C$. After a defined monitoring time, or once the adaptive filter 301 has stabilised (as could be assessed in a number of different ways as would be understood by one skilled in the art), the controller 304 may output a control signal $S_{CON}$ with information regarding the impedance characteristic of the audio load.

In some instances, the controller 304 could output the determined value of common impedance $R_C'$ or a value related thereto, e.g. an estimate of the impedance of the speakers $R_L$ or $R_R$ (equal to $2R_C'$).

In some instances, the controller 304 may additionally or alternatively output an indication as to whether the audio load falls within one or more defined impedance bands. For instance, in some implementations the controller may classify the load as being in a defined high impedance range and/or in a defined low impedance range depending on whether the determined impedance estimate $R_C'$, or related parameter, is above or below one or more defined thresholds.

It will be appreciated that the adaptive filter 301 has been described in terms of $R_C$ and $R_H$ for explanation but the values could be subject to various scaling factors and/or could be expressed in terms of $R_L$ or $R_R$ or other substantially equivalent formulations.

Figure 3B:
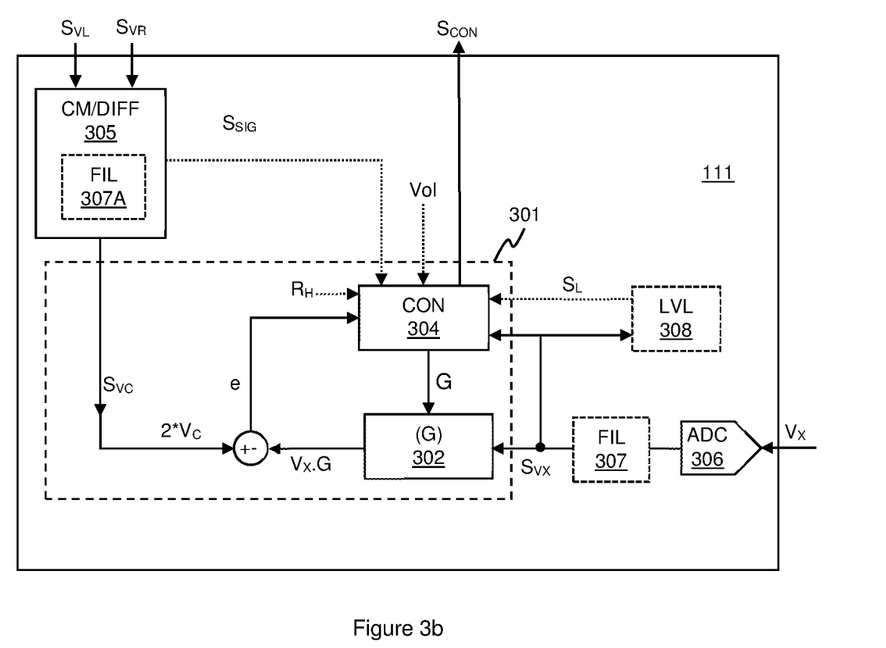

For example, FIG. 3*b* illustrates an alternative implementation of the adaptive filter according to another example. For this example, it is noted that equation 3 can be reformulated as:

$$2V_C = V_X \cdot (2 + 2R_C/R_H) \qquad \text{Eqn. 6}$$

The value $2V_C$ is equal to $V_L + V_R$ and thus may be easily determined by the CM module 305. The adaptive filter 301 may thus be arranged to minimise the error e of:

$$e = 2V_C - V_X \cdot G \qquad \text{Eqn. 7}$$

where G is the parameter of the adaptive filter 301 which is adapted and which corresponds to $G = (2 + 2R_C/R_H)$. This may provide a simpler calculation than the example illustrated in FIG. 3*a*, which may thus be implemented by an adaptive filter that requires less circuit area and/or with a reduced power consumption compared to the example of FIG. 3*a*.

In this example the gain block 302 may thus receive the indication $S_{VX}$ of the voltage $V_X$ and apply a gain factor G to provide a first value related to $G \cdot V_X$. As noted, the CM module 305 may provide a second value equal to $2V_C$, i.e. a value equal to $(V_L + V_R)$, as an output. The error e between the first and second values may be determined and the controller 304 may adapt the gain factor G to minimise the error. The controller 304 may adapt the parameter G according to:

$$G \rightarrow G - \mu.e.V_X \quad \text{Eqn. 8}$$

in a similar manner as discussed above in relation to FIG. 3a.

The parameter G, which is adapted by the adaptive filter in this example, is thus equivalent to $G=(2+2R_C/R_H)$. The value of the common impedance $R_C$ could therefore be determined from the value of the gain parameter G, although it may be desirable to determine the value $2*R_C$ as the indication of the impedance $R_L$ or $R_R$ of an individual one of the loudspeakers, for instance according to:

$$R_L = R_R = 2 \cdot R_C = (G-2) \cdot R_H \quad \text{Eqn. 9}$$

However, as noted, in some implementations it may be sufficient to provide an indication as to whether the individual loudspeaker impedance $R_L$ or $R_R$ is within one or more impedance bands, for example above or below one or more impedance thresholds. In such a case it would be possible to translate the required impedance threshold into a corresponding threshold for the gain parameter and determine the relevant impedance band using the value of the gain parameter G. For instance, if it is wished to determine whether the individual loudspeaker impedance $R_L$ or $R_R$ is above an impedance threshold $T_R$, it may simply be determined if the stabilised value of the gain parameter G is above a corresponding gain threshold $T_G$, where $T_G=2+(T_R/R_H)$. In some instances the impact of the resistance $R_H$ could be ignored, for instance in some implementations it may be assumed, to a sufficient margin of error, that $R_H$ has a value of 1Ω. In which case a value of G-2, or just G itself, could be taken as being a sufficiently accurate estimate of the load impedance $R_L$ or $R_R$ to be able to classify the load.

As noted, the operation of the adaptive filter 301 is to adapt a parameter based on the common impedance, e.g. an estimate of impedance $R_C'$, over time. On start-up or reset of the adaptive filter 301 the controller 304 may start with a predetermined value for the relevant parameter, e.g. the estimate $R_C'$. The initial value may be selected with regard to the expected range of impedances and a desired settling time. In some implementations, if there is a start-up impedance detect step, e.g. following detection of a plug insert or the like, the result of such a start-up impedance detect step could be used to determine a suitable starting point for the parameter to be adapted.

It can be seen from equation 5, or equation 8, that the size of each adaptation step, i.e. each adjustment of the previous estimate, may depend not only on the size of the error e but also the value of $V_X$. The value of $V_X$, in response to a given common-mode voltage $V_C$, will however be lower for high impedance audio loads than for low impedance audio loads. Thus, the settling time for the adaptive filter 301 may, in general, be faster when the audio load has a relatively low impedance than when the audio load has a relatively high impedance (assuming all other parameters of the adaptive filter such as convergence factor μ remain the same). The adaptation step size also depends on the convergence factor μ and using a larger value for the convergence factor μ could provide a faster settling time for high impedance audio loads, but too large a value for the convergence factor μ may negatively impact on stability for low impedance loads.

In some embodiments therefore the initial value of the adaptation parameter, e.g. the estimate of $R_C'$ or initial gain factor G, which is used on start-up or reset of the adaptive filter 301, may be selected to be a value which corresponds to an impedance value which is relatively high within the range of expected impedances, or the band of impedances of interest. If the audio load connected has a relatively low impedance, say of the order of only a few tens of ohms or lower, the adaptive filter may relatively quickly operate to reduce the value of the parameter, e.g. the estimate $R_C'$ of the impedance or gain factor G, and stabilise to a value corresponding to low estimate of $R_C$. If the audio load connected were instead to have a relatively high impedance, the parameter, e.g. estimate $R_C'$ of the impedance or gain factor G, may increase more slowly, but from a relatively high starting point.

In some embodiments the adaptive filter 301 may be configured such that the filter coefficient will, in the presence of a detectable signal at the monitoring node 112, adapt sufficiently to be able to make an estimate of impedance after a period of the order of 250 ms or so.

Figure 4:
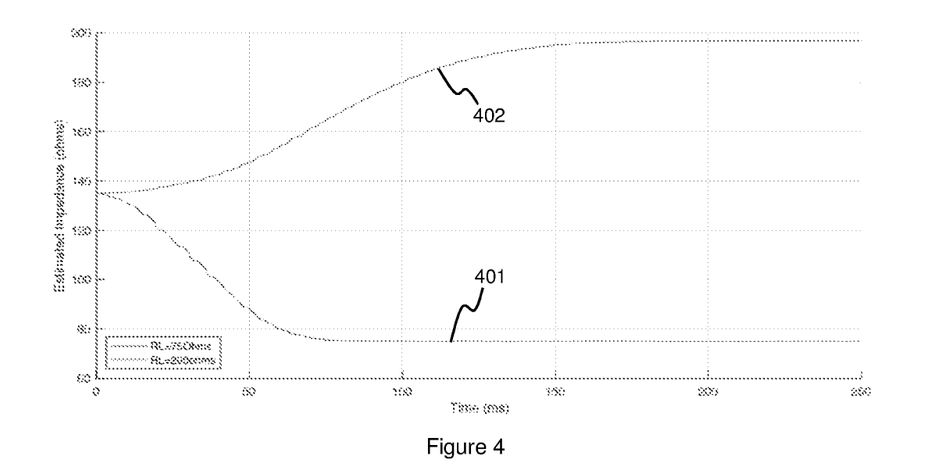
FIG. 4 shows simulated results adaptation of an adaptive filter.

FIG. 4 illustrates simulated results of the adaptation of an adaptive filter 301 such as that illustrated in FIG. 3a, for two different audio load impedances. In each case operation of the adaptive filter 301 was started with the same initial estimate of load impedance, in this example an impedance of 135Ω. Plot 401 illustrates how the estimated load impedance determined by the adaptive filter varied over time when the simulated audio load had a first impedance of 75Ω, and plot 402 shows how the estimated load impedance determined by the adaptive filter varied over time for a second, higher, value of load impedance of 200Ω. It can be seen that with the first, lower impedance, the estimate of load impedance and adapts and stabilises to a value around 75Ω relatively quickly, in this example within about 75 ms. For the second, higher, impedance, the estimate of the load impedance increases more slowly but in this example has stabilised to a value around 200Ω by about 200 ms. It will be clear however that a significant distinction between the estimated value of impedance exists between plots 401 and 402 from an earlier time period, and thus after 30 ms-100 ms the audio load could be classified as being significantly higher in impedance or lower in impedance than the starting estimate.

Thus when the audio circuitry 100 is enabled, e.g. after power-on or reset, and driving signals are supplied to a connected audio accessory apparatus 102, the load monitor 111 can monitor the voltage $V_X$ at the monitoring node 112, and can determine an impedance characteristic for the audio load, e.g. determine whether the audio load is one or more defined ranges of impedance or determine an estimate of the load impedance. In some implementations the load monitor 111 may be operable to determine the impedance characteristic within a monitoring period of 250 ms or less, and in some instances within a period of 100 ms or less, although in some implementations it may be desirable to allow a longer time to determine the impedance characteristic following any significant change to avoid issues with transients. The load monitor 111 may, once a relatively stable value of the relevant adaptation parameter is reached or after a certain defined monitoring period, generate a control signal $S_{CON}$ indicative of the impedance characteristic of the connected audio load. In some instances the control signal $S_{CON}$ from the load monitor 111 may be provided to some external circuitry, for instance a processor of the host device 101. In some embodiments the control signal $S_{CON}$ from the load monitor 111 may additionally or alternatively be used to set at least one parameter of the audio driving circuitry 100. In some examples the control signal $S_{CON}$ may be used to set a signal limit for the driving signals $V_L$ and $V_R$ so as to avoid high power/large amplitude driving signals being supplied to low impedance audio loads. In some examples the control signal $S_{CON}$ may be used to set a supply limit for the power supplies 104, for instance a maximum supply voltage level.

In use the load monitor 111 may continue to monitor the voltage $V_X$ at the monitoring node 112 during operation of the audio driving circuitry 100, for instance on a continuous basis, and the adaptive filter 301 may continue to maintain a value for the parameter related to the load impedance. The load monitor 111 may, for example, provide a substantially continuous estimate $R_C'$ of the load impedance.

If, in use, a different audio accessory 102 is connected to the audio driving circuitry 100, and the new audio accessory apparatus has a different impedance, the new audio accessory 102 will result in a different load impedance. In this case the value of the parameter related to load impedance, e.g. $R_C'$ or G, within the adaptive filter 301 will no longer be representative of the actual load impedance. As such the error e of the adaptive filter 301 will increase and the adaptive filter 301 will start adapting to the new audio load impedance. Over time the adaptive filter 301 will adapt to the new value of load impedance and thus the load monitor 111 will be able to detect a change in load impedance and provide an indication of the new load impedance.

At the point that a significant change in audio load impedance occurs, the parameter related to load impedance, e.g. $R_C'$ or G, may have been relatively stable at a value corresponding to the previous value of load impedance, which could be a relatively high value, say 400Ω or more, or could be a lower value, say of the order of 10Ω of so. The adaptive filter 301 will start adapting to the new value of load impedance, but it will need to adapt from that previous value, e.g. 400Ω or 10Ω, and thus the time taken to adapt to stabilise at the new value of load impedance may be longer than discussed above with respect to initial start-up.

For instance, consider that the audio load impedance changes from 400Ω to 75Ω and the adaptive filter 301 has a performance such as simulated in FIG. 4. The time taken to adapt to the new audio impedance value of 75Ω will include the time taken for the estimated value of $R_C'$ (in this example) to reduce from 400Ω to 135Ω, in addition to the 75 ms or so illustrated in FIG. 4 to reduce from 135Ω to 75Ω. Alternatively if the audio load impedance were instead to increase from say 10Ω to 200Ω, the time taken to adapt would include the time taken to adapt the estimated impedance from 10Ω to 135Ω in addition to the time illustrated in plot 402. As mentioned above, when the impedance is low the adaptation may be relatively fast as the value of $V_X$ may be greater. However when the impedance is high the small value of $V_X$ may mean that the adaptive filter 301 takes a longer time to increase the estimate of impedance.

In some examples therefore the controller 304 may be configured to monitor the error value e. If the error value suddenly goes high and remains high over several cycles of operation of the adaptive filter 301, this could indicate that there has been a significant change in audio load impedance. In which case, in some examples, the controller 304 may be configured to restart the adaptation process and start again with some new starting value. The new starting value may be the same initial value as used on power-on or reset or in some instances the new value may be selected based on the value of the relevant parameter, e.g. the estimate $R_C'$ of gain factor G, prior to the restart. In some examples the controller may periodically, perhaps a few times a second, store a value of the relevant parameter, e.g. the estimate $R_C'$, and/or other state variables of the filter and on restart these may be loaded into the filter.

Thus the load monitor 111 provide can provide a dynamic response to variations in audio load impedance in use.

It will be understood that in order for the adaptive filter to operate correctly there does need to be a detectable voltage $V_X$ at the monitoring node 112.

In some embodiments, to ensure a detectable signal at the monitoring node 112, the audio driving circuitry 100 may be operable, in at least one mode of operation, to add some signal component to at least one of the LEFT and RIGHT audio channels. For example, referring back to FIG. 1, a signal component generator 113 may be arranged to add some defined signal component to at least one of the audio signal paths. FIG. 1 illustrates the signal component generator adding some signal component to the digital part of the RIGHT audio channel but it will be appreciated that some component could additionally or alternatively be added to the LEFT audio channel and/or added in the analogue part of the signal path(s).

The added signal component could comprise some DC offset for the common-mode voltage $V_C$, which may be introduced gradually to avoid audible artefacts. Such an offset would not result in any audible component that could be heard by a user (apart from possibly at start-up/reset or power down of the audio driving circuitry). However adding a DC offset can adversely impact on power and bandwidth of the audio circuitry 100. In addition, if a small value offset were to be used, this would require the load monitor 111 to respond to small DC values, which would mean that the operation of the load monitor 111 would be sensitive to any unwanted or inherent circuit offset voltages that arise. In order to determine impedance based on a deliberately introduced offset component may, in some applications, involve a requirement for complex circuitry to calibrate out any such inherent circuit offsets.

The added signal component could comprise some pilot tone, i.e. a time varying signal with a predetermined signal variation or waveform. The pilot tone could be a signal with components at one or more predetermined frequencies, for instance a low frequency signal at a frequency of a few Hz, say 10 Hz. In some examples the same pilot tone component could be added to both audio channels. In other examples tones at different frequencies to one another could be added to the LEFT and RIGHT audio channels, which may be selected so as to be not harmonically related to aid demodulation. However, adding pilot tones into the driving signals $V_L$ and $V_R$ may introduce detectable audible content into the signal and may adversely impact the user experience in some situations, although various known techniques such as spreading and de-spreading may be implemented to try to reduce the likelihood of detection by a user.

In some embodiments the audio driving circuitry 100 may be operable, in at least one mode of operation, to rely on the driving signals $V_L$ and $V_R$ to generate a detectable voltage at the monitoring node 112. In other words, no deliberate signal content may be added to the audio channels. In use, when driving signals $V_L$ and $V_R$ representing audio content, such as music and/or speech, are being output to the audio accessory 102, it may be expected that detectable voltages will be present at the monitoring node 112. However, as described above the voltage $V_X$ at the monitoring node is proportional to the common mode voltage $V_C$. In general, the driving signals $V_L$ and $V_R$ may give rise to a sufficient common-mode voltage $V_C$ to allow the adaptive filter 301 to adapt to and track the value of the common impedance $R_C$. In some situations however there may be no, or only very little common mode component for the driving signals $V_L$ and $V_R$.

For example, where the driving signals $V_L$ and $V_R$ are both relatively low level signals, the common-mode component will also be low, and hence the voltage $V_X$ will be expected to be low. As noted above the size of the adjustment steps for adaptation of the adaptive filter 301 depend on the value of $V_X$ and thus the adaptive filter will adapt more slowly at low signals levels. In some embodiments, to maintain sufficiently fast adaptation of the adaptive filter 301, the size or value of the convergence factor μ, may be controllably varied in use based on an indication of driving signal level or the signal level of $V_X$. For instance at low signal levels, the convergence factor μ may be controllably increased by controller 304, to improve response time of the filter, whereas at higher signal levels the convergence factor μ may be controllably decreased by controller 304 to maintain stability. Various known methods for Normalised Least Mean Squares (NLMS) adaptation may be used to adjust the convergence factor.

The controller 304 may thus receive an indication of the expected signal level. For instance the CM module 305 may provide a control signal $S_{SIG}$ that may comprise an indication of the envelope value of the common mode voltage $V_C$, or an indication of the maximum signal level of the driving signals $V_L$ and $V_R$ and the controller 304 may control the convergence factor μ accordingly. In some embodiments the controller 304 may additionally or alternatively receive some external indication of likely signal level, for instance such as volume signal Vol indicating a user applied volume level and control the value of the convergence factor μ accordingly. In some embodiments the controller 304 may additionally or alternatively control the convergence factor μ based on the indication $S_{VX}$ of the voltage $V_X$ at the monitoring node 112. In some embodiments the controller 304 may additionally or alternatively control the convergence speed by replacing the $V_X$ term in Equation 5 or Equation 8 by a first value which is a function of $V_X$, i.e. $f_N(V_X)$, where $f_N(V_X)$ is some normalisation function which boosts the value of $V_X$ used for convergence for low values of $V_X$. For example, when the magnitude of $V_X$ is between some minimum value, possibly zero, and a threshold value $V_{Xth}$, the function $f_N(V_X)$ may maintain the value of $V_X$ used at some constant minimum value (which may be $V_{Xth}$). As examples, the normalisation function $f_N(V_X)$ may be a piecewise linear or polynomial or curvilinear function, and should preferably be continuous to avoid effective sudden changes in loop gain which might disturb the settling behaviour of the adaptation. The normalization function results in the ratio between the first value, as determined by $f_N(V_X)$, and the value of $V_X$ (i.e. the indication of return current) being greater for at least some lower values of $V_X$ than for some higher values of $V_X$.

The normalisation function $f_N(V_X)$ may be applied by the controller 304. The gain block 302 however can receive the indication $S_{VX}$ of the voltage $V_X$ and apply the relevant gain so that the error signal e is determined using the unmodified value of $V_X$.

In some circumstances there may be only a low level common mode voltage $V_C$, even when the signal levels of the driving signals $V_L$ and $V_R$ themselves have relatively high signal levels, if the driving signals are of similar amplitude but opposite phase. Such a scenario is rare in real music. One experiment showed only three one-second segments in which the common-mode component remained below half the driving signal out of 193 hours of music, equivalent to a fraction of less than 5 ppm of such one-second segments. However preferably the system should be designed to respond appropriately to artificial or deliberate antiphase test signals.

Thus, in some embodiments the CM module 305 may be configured to determine if there is a relatively high differential signal component between the driving signals, for instance to determine whether $V_L-V_R$ is greater than a threshold, whilst the determined signal $S_{VC}$ indicative of the common mode voltage $V_C$ is relatively low, for instance below a threshold. The CM module 305 may provide a control signal $S_{SIG}$ that may comprise an indication, e.g. a flag, that there is a high differential component but only a low common mode component. In some instances the controller 304 may be configured so as to pause any adaptation of the adaptive filter 301 if such a flag is received. When adaptation is paused the adaptive filter 301 may simply maintain the existing value of estimated impedance $R_C'$ until the flag is cleared, although in some embodiments, whilst the adaption of the adaptive filter 301 based on the voltage $V_X$ may be paused, some value of $V_X$ based on historic values could be used.

In any event if the voltage $V_X$ at the monitored node is very low, it may be beneficial to pause adaptation and tracking of the adaptive filter 301. If the voltage at the monitored node drops below a noise floor threshold associated with monitoring the node 112, e.g. a noise floor associated with ADC 306, then the adaptive filter 301 could simply be responding to noise. In some embodiments the controller 304 may thus be configured to only update the estimate $R_C'$ of impedance if the $S_{VX}$ of the voltage $V_X$ at the monitoring node is above a certain noise threshold. Alternatively the indication $S_{VX}$ of the voltage $V_X$ at the monitoring node 112 may be provided to a level detector 308 which may generate a level signal $S_L$ which may comprise a flag when the voltage $V_X$ is below a certain defined level $V_{XMIN}$ and the controller 304 may pause adaptation when the low level flag is active.

The level detector 308 may, in some embodiments, additionally or alternatively indicate, via level signal $S_L$, whether the voltage $V_X$ is above a defined upper magnitude threshold $T_U$. The upper threshold $T_U$ may be defined with respect to an upper limit of an impedance range classified as low impedance and a defined common mode voltage magnitude (which may for instance be a maximum expected common mode voltage magnitude), such that an audio load impedance above the upper limit would not result in a voltage $V_X$ with a magnitude greater than $T_U$, even for the maximum magnitude common mode voltage $V_X$. Thus if the magnitude of voltage $V_X$ is determined to be above $T_U$ this, by itself, can be an indication that the audio load impedance must be below the upper limit of the defined low impedance range. In other words a voltage threshold may be set that can only be achieved when operating with an audio load which is within the defined low impedance band and thus any detection of such a voltage level at the monitoring node 112 indicates that a low impedance load is connected.

The level detector 308 may additionally or alternatively indicate, via level signal $S_L$, whether the voltage $V_X$ is below a defined lower magnitude threshold $T_{LOW}$. The lower magnitude threshold $T_{LOW}$ may be defined with respect to a lower limit of an impedance range classified as high impedance and a defined common mode voltage magnitude, such that, if the common mode voltage is above the defined magnitude, an audio load with an impedance below the lower limit could not produce a voltage $V_X$ with a magnitude lower than $T_{LOW}$. If the magnitude of the voltage $V_X$ is determined to be below $T_{LOW}$, at a time that the common mode voltage magnitude is above the defined limit, this is thus an indication that the audio load impedance must be above the lower limit of the defined high impedance range. In other words a voltage threshold may be set such that, when the magnitude of the common mode voltage $V_C$ is above the defined limit, if the monitored voltage $V_X$ magnitude is not greater than the lower threshold $T_{LOW}$, it must have a load impedance within the defined high impedance band.

In some embodiments the controller 304 may thus receive the indications of signal level from the level detector 308 and, possibly together with an indication of signal level $S_{SIG}$, from the CM module 305, determine that the audio load impedance is within the defined high impedance band or the defined low impedance band. In which case the controller 304 might not enable the adaptive filter 301 and may simply output a control signal $S_{CON}$ indicating the load impedance, or may maintain the adaptive filter 301 in a paused state.

The use of signal level threshold for $V_X$ may thus constrain the situations in which the adaptive filter 301 is operated to provide an indication of load impedance $R_C$.

The level detector 308 may thus make use of the fact that a defined variation in the common mode voltage $V_C$ will result in a greater variation in $V_X$ when the audio load is low impedance than when the audio load is high impedance. The level of variation of the monitored voltage $V_X$ with respect to the level of variation of the common mode signal $V_C$ could be another way to characterise the impedance of the load, at least within certain defined categories. In some embodiments therefore the load monitor 111 of FIG. 1 could be configured to compare the degree of variation of $V_X$ over time with the degree of variation of $V_C$ over time and determine whether the ratio of the variation is within one or more defined ranges corresponding to defined impedance bands. Such operation could be implemented as an additional or alternative operating mode to use of the adaptive filter 301 and, in some examples, a load monitor could be implemented to monitor the relative variations in $V_X$ and $V_C$ without an adaptive filter.

However such an approach may suffer from issues with noise, and thus in at least some embodiments, the load monitor 111 comprises an adaptive filter arrangement, such as the adaptive filter 391 of FIG. 3.

Referring back to FIG. 3, as noted above load monitor 111 may comprise a filter arrangement 307 for filtering the output of ADC 306 to provide the indication $S_{VX}$ of the voltage $V_X$ at the monitored node 112.

The filter arrangement 307 may implement some highpass filtering to filter any DC offset associated with the ADC 306, although such filtering may not be applied if a DC offset is deliberately applied to at least one of the audio channels to ensure a signal of interest at the monitored node. If a controlled DC offset is deliberately applied it may be desirable to run a DC calibration before applying the DC offset, e.g. by running the adaptive filter 301 prior to applying the DC stimulus. The filter arrangement 307 may additionally or alternatively be implemented to apply some low pass filtering to restrict the monitored voltage to a signal range of interest. In particular in the case of an injected pilot tone the filter may be a narrow band-pass filter centred on the pilot tone frequency. The filtering applied may be configurable and may be configured in accordance with any deliberately applied signal component.

It will be understood that the impedance of audio loads may vary with frequency across the audible frequency range. If the audio driving signals $V_L$ and $V_R$ were to have reasonably consistent frequency content, the overall impedance across the frequency band may also appear consistent. However if the driving signals were to include signal content that was predominantly in a first frequency range at a first time but which changed to be predominantly in a second, different, frequency range at a second time, the effective impedance of the audio load may appear to change, and possibly quite significantly, between the first time and the second time. This could, incorrectly, be determined by the load monitor 111 as a change in the type of audio load connected.

The filter arrangement 307 may thus be configured to filter the output of ADC 306 to a signal band of interest, which may be frequency band over which the loudspeakers of each particular accessory apparatus may be expected to exhibit only a relatively small variation in impedance. In general, the parameter related to impedance which is determined by the adaptive filter, e.g. an estimate $R_C'$ of common impedance, will thus be determined according to the average of the in-band impedance (as defined by the filtering applied), based on the audio frequency content within that band.

It will be appreciated that the load monitor 111 as described herein is not concerned with identifying impedance changes that a particular set of stereo speakers may exhibit across the frequency range of operation, although in some implementations the impedance variation with frequency may be of interest for other reasons. Instead the load monitor 111 as described herein is concerned with whether there is an impedance change that indicates that a different audio accessory with a different impedance characteristic has been connected.

Some loudspeakers may also exhibit a phase change with frequency, which could impact correct operation of the adaptive filter. The filter arrangement 307 may thus be arranged to filter the signal indicative of $V_X$ to reduce any issues with respect to phase changes. Filter arrangement 307 may simply comprise a lowpass filter to restrict the frequency range or passband to one over which loudspeakers of all anticipated accessories do not show appreciable phase shift.

In some embodiments the filter arrangement 307 may be configurable. For instance the filter arrangement 307 may be configured with a first passband. If however the filtered signal $S_{VX}$ has no substantial content, as may be indicated by level detector 308, but the CM module indicates that there is a significant common mode voltage components, this could be due to there being little signal content within the passband. In which case the passband of the filter may be varied to a second different passband.

In some embodiments the measured impedance (or the determined parameter related to impedance if an explicit impedance value is not determined) may be monitored over time. If the impedance appears to be varying more often than expected, possibly even spending all or most of the time in one impedance band, various parameters associated with the adaptation may be altered, for example the convergence factor $\mu$ or normalisation function $f_N(V_X)$ may be altered in order to slow the convergence or smooth the inputs to the adaptive filter to in effect "filter out" any large ripple in the estimated impedance.

Filter arrangement 307 may for example comprise some form of envelope detector, for instance an absolute-value function followed by a low-pass filter. This low pass filter may have a cut-off frequency below audio signal frequencies so that the output signal is below the audio signal band, and represents a type of envelope of the signal. If the impedance appears to be varying more often than expected this cut-off frequency may be autonomously varied in use.

Any filter function performed by filter arrangement 307 to produce $S_{VX}$ should preferably also be replicated and applied to the processing producing signal $S_{VC}$, e.g. by filter arrangement 307A.

The description so far has described in terms of a single tap filter, where the gain or weight of this tap converges to a single value indicative of the impedance of the load from which an indication of a high or low impedance load may be extracted.

Other examples may comprise a multi-tap adaptive filter. This may adapt by a similar LMS algorithm for example. The general operation of such a multi-tap adaptive filter will be similar to that described above, except that the tap weights converge to a set of values dependent upon the impulse response of the impedance of the load. Estimates of the load impedance at DC and other frequencies may be extracted, for example by a Discrete Cosine Transform of the tap weights, from which a value of the impedance at a set of frequencies may be obtained. This provides more information about the load impedance of the accessory rather than just a DC value, and is also more tolerant to phase or delay dependence on frequency.

There are various scenarios described above in which the adaptation of the loop filter is paused or halted. Depending on the identity and severity of the issue causing the adaptation to be halted, the adaptation may require to be restarted after the condition clears. The adaptation may be restarted using the state variable values present at the instant that the adaptation was actually halted. However in many scenarios there may be some delay between the onset of the condition causing the need for adaptation to be paused and the actual detection of the condition and the actual pausing of the adaptation, so the state variables may have moved away from their converged values, possibly extremely far away. On restart, the previous history may thus be ignored and adaptation restarted from some default conditions, e.g. corresponding to convergence at some defined impedance value detection as described above. However in some scenarios it may be suspected that the accessory has not actually been changed, and the condition was due to some transient effect, for example a ground current pulse due to an accessory button press. In such cases, to speed up convergence, the adaptation may be advantageously restarted using initial values for the state variables corresponding to what they were before the onset of the transient condition. Thus the controller may store values for the state variables periodically, for example every second, or storing a rolling buffer of values every 250 ms for the last two seconds.

These stored values are then available and may be used in setting the state variables after a condition clears and the adaptation is restarted.

Embodiments thus provide a load monitor 111 for monitoring an audio load driven by audio driving circuitry 100, in particular where the audio load is a stereo audio load comprising first and second, e.g. left and right, audio loads, i.e. loudspeakers 106, of an accessory apparatus 102, for example headphones or earbuds or the like, that may be electrically coupled to the audio driving circuitry in use via a removable connection 108 and 110. The load monitor determines an indication of impedance of the stereo load.

It will be understood that estimating load impedance generally requires measures of load voltage and load current. The load voltage driven into the loudspeaker can be determined for measuring the driving signal voltage applied, i.e. $V_L$ or $V_R$, or by estimating these voltages from knowledge of the audio driving signal. However sensing current at these driving nodes can be complex. An indication of current could be sensed by determining a voltage drop across a sense resistor, but any such sense resistance should be small to minimise any loss of output power and the driving signals comprise relatively large amplitude voltage signals, say of the order of 3V rms.

The load monitor 111 of embodiments of the present disclosure thus monitors the electrical properties of the return path, to provide a measure related to return current. For stereo audio accessories however the two loudspeakers are coupled to the same ground contact, e.g. of a jack-plug of the accessory apparatus and thus the load monitor 111 can only access the shared ground return path, which may also be a ground return path for some other components of the accessory apparatus, such as a microphone and/or one or more control buttons or switches for example.

The load monitor 111 thus uses an indication of the common-mode voltage $V_C$ applied to both the first and second audio loads, together with an indication of the return current, e.g. the monitored voltage $V_X$ to determine a parameter related to the common impedance of the stereo load. It can be assumed that the impedance of the stereo loads are approximately the same as one another, i.e. any mismatch in load impedance between the first and second audio loads of the accessory may be relatively small, and the determined parameter related to the common impedance of the stereo load can thus be used to characterise the load impedance. The load monitor 111 may thus determine at least one impedance characteristic of the audio load.

The load monitor 111 can operate during the output of driving signals $V_L$ and $V_R$ from the audio driving circuitry and monitors a node 112 of the ground return path to determine a parameter related to the impedance of the audio load. In at least one mode of operation the load monitor 111 may rely on inherent signal content in the driving signals $V_L$ and $V_R$ to provide a detectable signal at the monitored node 112, although in some embodiments some additional signal component could be deliberately added, such as a pilot tone or DC offset, either continuously or periodically or at times determined by the load monitor when the driving signals $V_L$ and $V_R$ are not sufficient for monitoring.

It will be appreciated that impedance monitoring of loudspeakers when in use has been proposed for other reasons, for instance as part of a temperature measurement and/or protection system for the loudspeaker. The voice coil impedance may vary with temperature in a known way with temperature so that a variation in impedance can be used to determine an indication of temperature. In such implementations however the temperature monitoring circuit or the like would be implemented so as to monitor the individual load voltage and load current for one loudspeaker so as to provide an indication of any impedance variations for that particular loudspeaker.

The load monitor 111 of the present disclosure, as mentioned, monitors the common mode voltage and the shared return path and can detect any significant changes in the impedance of the whole of the audio load that is indicative that a different accessory apparatus has been connected to the audio driving circuitry. The load monitor 111 may output at least one control signal indicative of the impedance characteristic of the complete audio load and/or any significant change in the impedance characteristic of the entire audio load. At least some parameters of the audio circuitry may be controlled based on the determined impedance characteristic, for instance a maximum supply voltage for the output driver, or a maximum input signal level, controlled for example by directly or indirectly instructing some upstream gain block.

In some embodiments some other aspects of operation of the audio driving circuitry may also be monitored to provide information about the audio load. For instance the power supply 104 may include some current limiter to limit current supply. If the current limit is reached this can be indicative that a large current is being drawn by the load. The power supply 104 may thus be configured to generate a signal indicating when the current limit is reached. Additionally or alternatively the output driver may have a clip detector for detecting when the output from the output driver is clipping or may be about to clip. The clip detector may generate a signal when the output driver is clipping. Such signals from the power supply and/or the output driver may be provided to the load monitor, which may use the signals to aid in classifying the type of load and/or in determining when to activate the adaptive filter 301. In some implementations the clip detect signals and/or the current limit signals could be used to set any limits on the power supply voltage and/or the maximum voltage of the driving signal independently of any impedance determination.

As mentioned above, an accessory may be connected to a host device via a four pole arrangement, for instance such as the known TRRS (tip-ring1-ring2-sleeve) socket arrangement. In addition to three signal paths for two loudspeakers and a shared ground return, there may be a fourth signal path. This fourth path may provide current for other components of the accessory, for example a microphone or signal processing circuitry provided as part of the accessory or bias for one or more switches.

Any current supplied by this fourth connection, or any applied current modulation, may appear in the ground return path.

For example, some accessories include a control button that, if activated, may give a relatively long pulse in DC current. In some implementations the controller 304 of the load monitor 111 may receive notification of this button press and pause adaptation of the adaptive filter 301 or raise a flag signal to warn of invalid output. However, typically, will be at least some debounce delay in detection of the button press, so the adaptive filter may have adapted the relevant parameter based on $V_X$ including a button press component, and thus veered off from the correct value. It may therefore be beneficial in some implementations to restart the adaptive filter 301 as discussed above after the button press has finished. As noted above any such restart of the adaptive filter 301 may use at least some state variables (e.g. the parameter $R_C{}'$ or gain value G together with the error value e) stored in periodic archive as described above.

It will be appreciated however that any return current component due to some other component of the accessory is very likely to be uncorrelated with the common mode voltage applied to the audio load, i.e. the speaker driving signals $V_L$ and $V_R$. Thus, to a large extent, some a signal component at the monitored node may be seen as noise, and the adaptive filter will not converge to it.

If desired however the current contribution to the ground return path from sources other than the audio loads could be determined and compensated for, for instance by adding a correction to the indication $S_{VC}$ of the common voltage $V_C$ and/or by correcting the indication $S_{VX}$ of the voltage $V_X$.

As described above, in some embodiments, the adaptive filter 301 of the load monitor may determine an actual estimate for the impedance of the audio load. In some instances this estimate of impedance may additionally be used for crosstalk cancellation.

Figure 5:
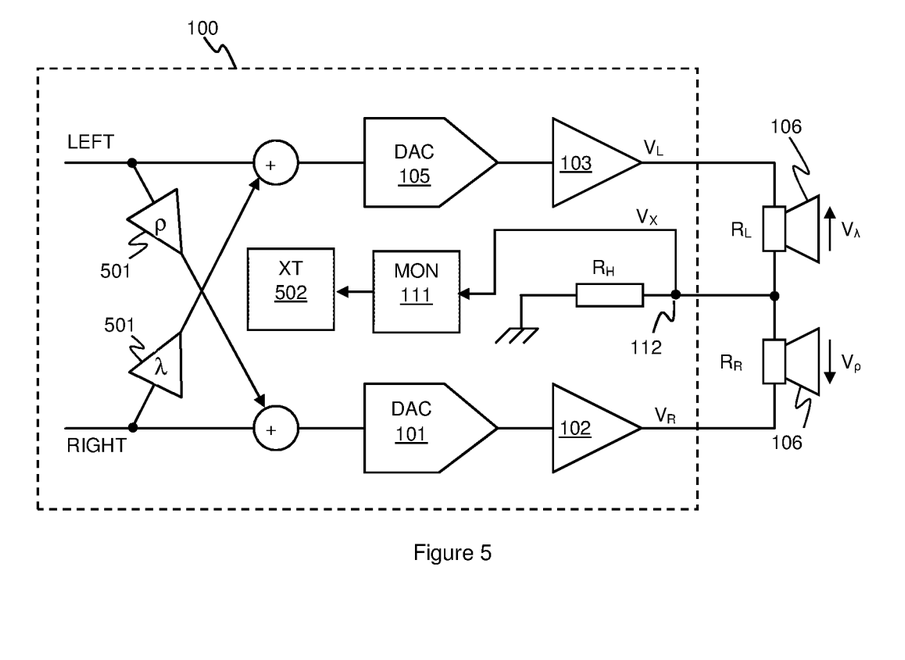
FIG. 5 illustrates an embodiment with crosstalk mitigation.

For stereo loudspeakers with a common ground return path, such as illustrated in FIG. 1, there can be unwanted crosstalk between the two audio channels. As will be understood by one skilled in the art and from the discussion above, if the left driving signal $V_L$ were to be zero volts (0V), then, ideally, the voltage across the left loudspeaker 106 would be zero. However the voltage at the node $V_X$ also depends on the driving voltage $V_R$ and hence some of the driving signal for the RIGHT channel can be present across the left loudspeaker. To mitigate this problem it is known to deliberately add a proportion of the signal from the right channel into the left channel with a gain factor $\lambda$ and to add a proportion of the signal from the right channel into the left channel with a gain factor $\rho$. FIG. 5 illustrates such a crosstalk compensation arrangement where signals are tapped from the LEFT and RIGHT audio channels and have gains $\rho$ and $\lambda$ applied by gain elements 501, before being added into the other channel (downstream of the tap points). The driving signal $V_L$ thus has a signal level equal to $V_{LS}+\lambda V_{RS}$ and the driving signal $V_R$ has a signal level equal to $V_{RS}+\rho V_{LS}$ where $V_{LS}$ and $V_{RS}$ are the voltage levels due to the signal content of the respective audio channel.

The gain factors $\lambda$ and $\rho$ are chosen to provide crosstalk mitigation.

Consider that the signal level voltage for the LEFT audio channel is zero, i.e. $V_{LS}=0$. In this case the voltage $V_L$ applied to the left loudspeaker is equal to $\lambda V_{RS}$. No current will flow through the left loudspeaker if the current through the right loudspeaker is equal to the current of the ground return path, i.e. the voltage at node $V_X$ is equal to $\lambda V_{RS}$.

It can be shown that this occurs when the gain factor $\lambda$ is equal to $R_H/(R_L+R_H)$. Likewise, by a similar analysis it can be shown that the gain factor $\rho$ should be equal to $R_H/(R_R+R_H)$. The value of the ground return path may be known, but it will be seen that for effective crosstalk mitigation the gain factors $\lambda$ and $\rho$ should also be based on the impedance of the loudspeakers, i.e. of the audio load.

In some embodiments therefore an estimate of the impedance may be determined by the load monitor 111 and supplied to a crosstalk module 502 to determine suitable gain factors $\rho$ and $\lambda$ to be applied by gain elements 501. The crosstalk module 502 may calculate the gain factors based on the determined value of impedance or may use a look-up table or like. Alternatively, in some embodiments the parameter determined by the adaptive filter may be the gain factors $\rho$ and $\lambda$ (it will be clear that for the case where $R_R=R_L$ then the gain factors $\rho$ and $\lambda$ are equal). It will be clear that the error equation of equation 4 could be recast on both sides so that the first value being determined is equal to the gain factors $\rho$ and $\lambda$, in which case the load monitor may determine the crosstalk gain factors directly and may use the value of the gain factors to determine some information about the load characteristics.

Embodiments of the present disclosure thus relate to methods and apparatus suitable for detecting any significant change in load impedance dynamically in use of an audio driving circuit.

There may be some initial impedance characterisation step, for instance a DC impedance detection, on first power-on or reset of the audio driving circuitry and/or following some jack insert detection. The methods and apparatus of the present invention may allow for continual monitoring for any other significant changes in load impedance, for instance when music or other audio is playing. On detection of any significant change of the load impedance, e.g. the impedance varies across a threshold, which may be programmable, an interrupt or other control signal could be raised and/or various parameters of operation of the audio driving circuitry adjusted. For example that could be a ramp down or limiting of an applied volume.

At least some embodiments relate to a load monitor which monitors the properties of the shared return path for a stereo load, e.g. to determine an indication of a common mode ground return current. This indication of load current may be digitised and processed and used together with an indication of the audio driving signals to determine an impedance characteristic, e.g. to classify the load as high impedance or low impedance. In some embodiments the impedance characteristic may be determined using a least square algorithm, e.g. via an LMS adaptive filter arrangement.

The indication of return current may be determined by an ADC determining a voltage of the return path, conveniently a voltage across a MOS device such as a switch of the return path. A level detector may determine if the determined value is above an upper threshold or below a lower threshold. The indication of the stereo driving signals may be summed to determine a common mode component. A check may be performed to determine whether there is sufficient common-mode component. If not the operation of the LMS algorithm may be paused and/or some signal content could be deliberately added to at least one of the driving signals, e.g. if there is sufficient signal content in an individual channel, a DC stimulus could be added or some pilot tone injected. Any deliberately added content may ramp up or down in a configurable way and may have a configurable amplitude. Filtering of the common mode component of the driving signals and the monitored current signal could be adapted for the added content.

In general, when using the audio content, the inputs to the adaptive filter may be filtered to remove DC and to limit to a suitable band. The adaptive filter may determine a parameter value related to the average impedance across the frequency band.

As noted the load monitor may determine and raise a flag when the common mode component of the driving signals is too low. Also, if the return current is greater than an upper threshold this may be sufficient to characterise the load as low impedance or if the return current is lower than a lower threshold this may be sufficient to characterise the load as high impedance. If the current is between these limits, the adaptive filter may be enabled to determine the parameter relating to load impedance, although any clip detect in the output amplifier or current limiting in the power supply could be used as warnings that the output of the load monitor may not be accurate.

Embodiments may be implemented as an integrated circuit which in some examples could be an audio codec or similar. Embodiments may be incorporated in an electronic device, which may for example be a portable device and/or a device operable with battery power. The device could be a communication device such as a mobile telephone or smartphone or similar. The device could be a computing device such as notebook, laptop or tablet computing device. The device could be a wearable device such as a smartwatch. The device could be a device with voice control or activation functionality.

The skilled person will recognise that some aspects of the above-described apparatus and methods, for example the discovery and configuration methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re) programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

The invention claimed is:

1. Audio driving circuitry comprising:
   first and second audio channels for outputting first and second audio driving signals for a stereo audio load comprising first and second audio loads;
   a common return path for the first and second audio loads to a defined reference voltage; and
   a load monitor configured to monitor an indication of a common mode return current passing through the common return path and an indication of a common mode component of the first and second audio driving signals and determine an impedance characteristic of the stereo audio load when the first and second audio channels are outputting said first and second audio driving signals comprising audio content.

2. Audio driving circuitry as claimed in claim 1 wherein the load monitor comprises an adaptive filter for adapting a parameter related to the impedance of the stereo audio load.

3. Audio driving circuitry as claimed in claim 2 wherein the adaptive filter is configured to minimise an error between a first value and a second value, wherein the first value is based on the indication of a common mode return current and the parameter related to impedance.

4. Audio driving circuitry as claimed in claim 3 wherein the second value is based on the indication of common mode component of the first and second audio driving signals.

5. Audio driving circuitry as claimed in claim 3 wherein the adaptive filter comprises a controller configured to iteratively adapt a present value of the parameter related to impedance by an adaption value proportional to the error between the first and second values.

6. Audio driving circuitry as claimed in claim 5 wherein the controller is configured such that the adaption value is also proportional to the first value based on the indication of the common mode return current.

7. Audio driving circuitry as claimed in claim 6 wherein the controller is configured to determine the first value as a function of the indication of the common mode return current such that a ratio between the first value and the indication of the common mode return current is greater for at least some values of the indication of the common mode return current in a lower range than for at least some values of the indication of the common mode return current in a higher range.

8. Audio driving circuitry as claimed in claim 5 wherein the controller is configured such that the adaption value is also proportional to a convergence factor wherein the controller is configured to vary a value of the convergence factor based on an indication of expected signal level such that the convergence factor is greater for at least some lower expected signal levels than for at least higher expected signal levels.

9. Audio driving circuitry as claimed in claim 2 wherein the adaptive filter implements a least mean squares algorithm.

10. Audio driving circuitry as claimed in claim 2 wherein the adaptive filter comprises a single tap adaptive filter.

11. Audio driving circuitry as claimed in claim 1 wherein the common return path comprises a resistance between a monitoring node and the defined reference voltage and the indication of the common mode return current comprises a voltage of the monitoring node.

12. Audio driving circuitry as claimed in claim 1 wherein the load monitor comprises a common-mode module configured to receive an indication of the first and second audio driving signals and determine said indication of the common-mode component.

13. Audio driving circuitry as claimed in claim 12 wherein the common-mode module is further configured to determine a differential component of the first and second audio driving signals and wherein the load monitor is configured to determine if there is insufficient common-mode component of the driving signals compared to the differential component, and, in the event that an insufficient common-mode component is detected, to pause determination of the impedance characteristic.

14. Audio driving circuitry as claimed in claim 13 wherein the load monitor is configured to determine if there is an insufficient common-mode component compared to the differential component, if the common-mode component is below a defined common-mode threshold whilst the differential component is above a differential threshold.

15. Audio driving circuitry as claimed in claim 1 wherein the load monitor comprises a level detector configured to determine whether the indication of common mode return current is at least one of:
above a defined upper magnitude threshold corresponding to an upper limit of an impedance range classified as low impedance; and
below a defined lower magnitude threshold corresponding to a lower limit of an impedance range classified as high impedance.

16. Audio driving circuitry as claimed in claim 15 wherein the level detector configured to determine whether the indication of common mode return current is below a noise threshold and wherein the load monitor is configured to pause determination of the impedance characteristic if the indication of common mode return current is below the noise threshold.

17. Audio driving circuitry as claimed in claim 1 wherein each of said first and second audio channels comprises a respective audio output driver powered by a power supply and wherein, based on the indication of impedance determined by the load monitor, the audio driving circuitry is configured to control at least one of:
a maximum output voltage magnitude of an audio output driver; and
a maximum output voltage magnitude from the power supply to the audio output driver.

18. An electronic device comprising audio driving circuitry as claimed in claim 1 and a connector for making a removable mating connection with an accessory apparatus in use, wherein said first and second audio channels are configured to output said first and second audio driving signals to first and second electrical contacts of said connector and the common return path connects to a third electrical contact of said connector.

19. Audio driving circuitry comprising:
first and second audio channels for outputting first and second audio driving signals for a stereo audio load comprising first and second audio loads;
a common return path for the first and second audio loads to a defined reference voltage; and
a load monitor configured to monitor an impedance characteristic of the stereo audio load so as to detect any changes in impedance characteristic in use when the stereo load is being driven with the first and second audio driving signals;
wherein the load monitor is configured to receive an indication of a common mode return current passing though the common return path and an indication of a common mode component of the first and second audio driving signals and determine said impedance characteristic.

20. Audio driving circuitry comprising:
first and second audio channels for outputting first and second audio driving signals for a stereo audio load comprising first and second audio loads;
a common return path for the first and second audio loads to a defined reference voltage;
a load monitor configured to determine an impedance characteristic of the stereo audio load;
wherein the load monitor is configured to determine a common mode component of the first and second audio driving signals being output to the stereo load and monitor an indication of a common mode return current passing though the common return path to determine said impedance characteristic.

* * * * *

UNITED STATES PATENT AND TRADEMARK OFFICE
CERTIFICATE OF CORRECTION

| | | |
|---|---|---|
| PATENT NO. | : 11,653,150 B2 | Page 1 of 1 |
| APPLICATION NO. | : 17/516830 | |
| DATED | : May 16, 2023 | |
| INVENTOR(S) | : Lesso et al. | |

It is certified that error appears in the above-identified patent and that said Letters Patent is hereby corrected as shown below:

In the Claims

1. In Column 26, Line 37, in Claim 19, delete "though" and insert -- through --, therefor.

2. In Column 26, Line 53, in Claim 20, delete "though" and insert -- through --, therefor.

Signed and Sealed this
First Day of August, 2023

Katherine Kelly Vidal
*Director of the United States Patent and Trademark Office*